(12) United States Patent
Biehl et al.

(10) Patent No.: US 10,199,190 B2
(45) Date of Patent: Feb. 5, 2019

(54) ACTIVE ELECTRICAL COMPONENT

(71) Applicant: TE Connectivity Germany GmbH, Bensheim (DE)

(72) Inventors: Wilfried Biehl, Berlin (DE); Titus Ziegler, Berlin (DE); Harry Koch, Berlin (DE); Thomas Haehnel, Berlin (DE)

(73) Assignee: TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 15/072,131

(22) Filed: Mar. 16, 2016

(65) Prior Publication Data

US 2016/0196939 A1 Jul. 7, 2016

Related U.S. Application Data

(63) Continuation of application No. PCT/EP2014/069864, filed on Sep. 18, 2014.

(30) Foreign Application Priority Data

Sep. 20, 2013 (DE) .................. 10 2013 219 009

(51) Int. Cl.
*H01H 33/02* (2006.01)
*H01H 45/14* (2006.01)
*H01H 50/14* (2006.01)
*H05K 3/30* (2006.01)
*H01R 12/58* (2011.01)

(52) U.S. Cl.
CPC ............ *H01H 45/14* (2013.01); *H01H 50/14* (2013.01); *H05K 3/308* (2013.01); *H01R 12/585* (2013.01); *H05K 2201/1059* (2013.01); *H05K 2201/10878* (2013.01)

(58) Field of Classification Search
CPC ........ H01H 50/14; H01H 45/14; H05K 3/308; H05K 12/585; H05K 2201/1059; H05K 2201/10878; H01R 12/585
USPC .................................................. 200/237, 5 A
See application file for complete search history.

(56) References Cited

U.S. PATENT DOCUMENTS

| | | | |
|---|---|---|---|
| 2,476,056 A | * | 7/1949 | Martin ................ H01H 13/365 200/447 |
| 4,229,719 A | * | 10/1980 | Lemmer ............... H01H 50/14 335/132 |

(Continued)

FOREIGN PATENT DOCUMENTS

| | | |
|---|---|---|
| CN | 1455429 A | 11/2003 |
| DE | 3925958 C1 | 5/1989 |

(Continued)

OTHER PUBLICATIONS

German Office Action, dated Jul. 23, 2014, 5 pages.

(Continued)

*Primary Examiner* — Anthony R. Jimenez
(74) *Attorney, Agent, or Firm* — Barley Snyder

(57) ABSTRACT

An active electrical component is disclosed. The active electrical component comprises a contact extending away from an outer side of the component in an insertion direction, and a force transmission structure extending to the contact in a continuous manner from a side of the component opposite the contact.

20 Claims, 4 Drawing Sheets

(56) References Cited

U.S. PATENT DOCUMENTS

| | | | |
|---|---|---|---|
| 4,547,640 A * | 10/1985 | Kashiwagi | H01H 33/6644 |
| | | | 200/262 |
| 5,684,280 A * | 11/1997 | Franz | H01H 1/36 |
| | | | 200/16 R |
| 5,801,930 A | 9/1998 | Dittmann | |
| 6,002,312 A | 12/1999 | Dittmann et al. | |
| 8,115,124 B2 * | 2/2012 | Maruyama | H01H 1/5822 |
| | | | 200/50.27 |
| 2009/0233468 A1 | 9/2009 | Yamashita et al. | |

FOREIGN PATENT DOCUMENTS

| | | |
|---|---|---|
| DE | 19618497 A1 | 11/1997 |
| JP | 62-195944 | 12/1987 |
| JP | 2008-171948 | 7/2008 |
| JP | 2009-218455 A | 9/2009 |

OTHER PUBLICATIONS

PCT Notification, International Search Report and Written Opinion, Intl App. No. PCT/EP2014/069864, dated Jan. 19, 2015, 10 pages.
Chinese secnd office action and English translation, Application No. 2014800516615, dated Sep. 13, 2017, 17 pages.
Abstract of JP2008171948, dated Jul. 24, 2008, 2 pages.
Chinese Third Office Action, English translation, dated Mar. 21, 2018, 9 pages.
Japanese Notice of Reasons for Refusal and English translation, dated May 31, 2018, 6 pages.
Abstract of CN1455429, dated Nov. 12, 2003, 1 page.

* cited by examiner

ACTIVE ELECTRICAL COMPONENT

CROSS-REFERENCE TO RELATED APPLICATIONS

This application in a continuation of International Patent Application No. PCT/EP2014/069864, filed on Sep. 18, 2014, which claims priority under 35 U.S.C. § 119 to German Patent Application No. 102013219009.3, filed on Sep. 20, 2013.

FIELD OF THE INVENTION

The present invention relates to an active electrical component, and more particularly, to a switching element such as a relay or a contactor.

BACKGROUND

Switching elements are often connected to a counter-element in an electrically conductive manner by means of a contact and a counter-contact. As is known in the prior art, a plug type contact is inserted into a mating plug type contact, and only small forces are required to insert and subsequently separate the connection. This known connection is thus unreliable since it can be readily separated unintentionally. The prior art alternatively discloses soldering the contact and counter-contact to each other. However, this leads to thermal loading and is complex in terms of production technology, leading to increased costs.

SUMMARY

An object of the invention, among others, is to provide an active electrical component which can be readily fitted in a reliable manner to a counter-element and which is particularly suitable for high currents. The disclosed active electrical component comprises a contact extending away from an outer side of the component in an insertion direction, and a force transmission structure extending to the contact in a continuous manner from a side of the component opposite the contact.

BRIEF DESCRIPTION OF THE DRAWINGS

The invention will now be described by way of example with reference to the accompanying figures, of which.

DETAILED DESCRIPTION OF EMBODIMENT(S)

The invention is explained in greater detail below with reference to embodiments of an active electrical component. This invention may, however, be embodied in many different forms and should not be construed as limited to the embodiments set forth herein; rather, these embodiments are provided so that this disclosure will be thorough and complete and still fully convey the scope of the invention to those skilled in the art.

Figure 1:
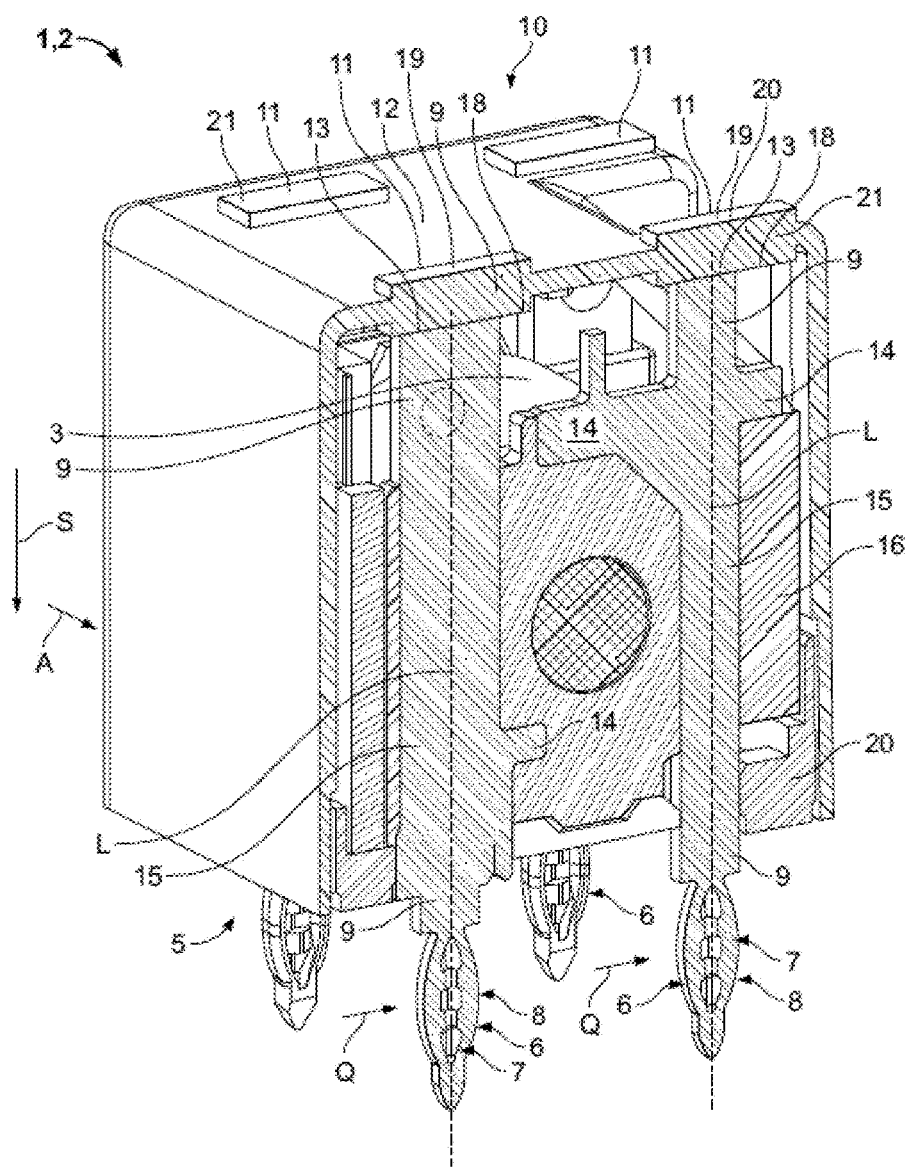
FIG. 1 is a partially sectioned perspective view of a first embodiment of an active electrical component according to the invention.

An active electrical component 1 according to the invention is shown in FIG. 1. The active electrical component 1 may be a relay 2, and includes a coil 3, an armature 4, contacts 6, force transmission structures 9, and a housing 12.

The major components of the invention will now be described in greater detail.

The plurality of contacts 6 may be constructed as plug type contacts 7, and also as pressing contacts 8. The contacts 6 may be in the form of an eye of a needle; metal sheets which act as springs are arranged in the eye of the needle such that, in a transverse direction Q which extends transversely relative to the insertion direction, a high resilient force is produced. A high retention force in a counter-contact and a high current-carrying capacity may be achieved by the pressing contacts 8.

The force transmission structures 9 may be chains of rigid members and terminate in pressing faces 11. Each force transmission structure 9 may integrally comprise the contact 6 and be part of the housing 12. A force transmission structure 9 is constructed in this instance by a chain of two rigid members. In other embodiments, the force transmission structure may also comprise more than two rigid members, for example, three, four or even more rigid members. The individual rigid members may in this instance have different properties; a rigid member may, for instance, be particularly stable and be used for mechanical securing. Another rigid member may be electrically conductive and be used for electrical contacting. The force transmission structures 9 each have side elements 14, to which other members of the component 1 may be fitted.

The housing 12 may, for example, comprise a metal or plastics material. In order to keep production costs low, the housing 12 may be produced from a thermoplastic material in an injection-moulding method. One with ordinary skill in the art at the time of the invention would understand that other materials could also be used. The housing 12 has a thickened portion 21, as shown in FIG. 1, delimited in and counter to an insertion direction S by internal faces 18 and external faces 19 which each extend perpendicularly relative to the insertion direction S.

The assembly and use of the active electrical component 1 will now be described.

The component 1 is constructed to be connected to a counter-element. Specifically, the contacts 6 can be connected in an insertion direction S to a counter-contact. The counter-contact may be a socket or a hole. For example, it is possible to use a printed circuit board or a lead frame as a counter-element.

The plurality of contacts 6 are positioned at a lower side 5 of the active electrical component 1. The contacts 6 extend in each case perpendicularly and away from the lower side 5 in the insertion direction S. The contacts 6 extend in this instance inside the base face of the lower side 5, they are thus not located laterally beside the component 1, and consequently, the lateral structural size of the component 1 does not increase.

The plurality of force transmission structures 9 extend to the contacts 6 from a side 10 opposite the contacts 6 in a continuous linear manner in a load direction L. The force transmission structures terminate in pressing faces 11 which are arranged in alignment with the contacts 6 with respect to the insertion direction S. In the embodiment shown in FIG. 1, the pressing faces 11 are formed by the housing 12. The pressing faces 11 are reinforced with respect to their immediate environment in order to be able to absorb high forces; the wall thickness of the housing 12 is thicker in the region of the pressing faces 11 than in other regions.

The housing 12 is in abutment with the remainder of the force transmission structures 9 in the region of the pressing faces 11. The inner faces 18 of the thickened portion 21 of the housing 12 are in direct abutment with end faces 13 of the remainder of the force transmission structure 9. When a force acts on the pressing faces 11 in the insertion direction S, this is transmitted directly into the remainder of the force transmission structures 9, for example, without the housing 12 bending.

The force transmission structures 9 may act as a carrier frame 15 for the component 1. For example, portions of the coil member 16 are fitted to lateral elements 14. Furthermore, a base portion 20 of the component 1 is fitted to the force transmission structure 9.

The force transmission structures 9 enable a force to be transmitted to the contacts 6 from the side 10 opposite the contacts 6 without mechanically loading other members of the component 1. In particular, the force transmission structures 9 can be used in order to connect the component 1 to a counter-element by force being applied at the side 10 opposite the contacts 6 in the insertion direction S. The force transmission structures 9 enable the application of high forces which are required to connect the contacts 6 to the counter-contacts in a mechanically stable manner and so as to conduct a high current. The plurality of members of the force transmission structure 9 are in mutual abutment and thus ensure a continuous structure, which enables the force to be transmitted to the contact 6 from the side 10 opposite the contact 6 without other members of the component 1, such as the coil 3, being excessively mechanically loaded and potentially damaged.

A coil 3 of the relay 2 can be switched using currents of different strengths. In this instance, an armature 4 can be moved in and counter to a movement direction A.

Figure 2:
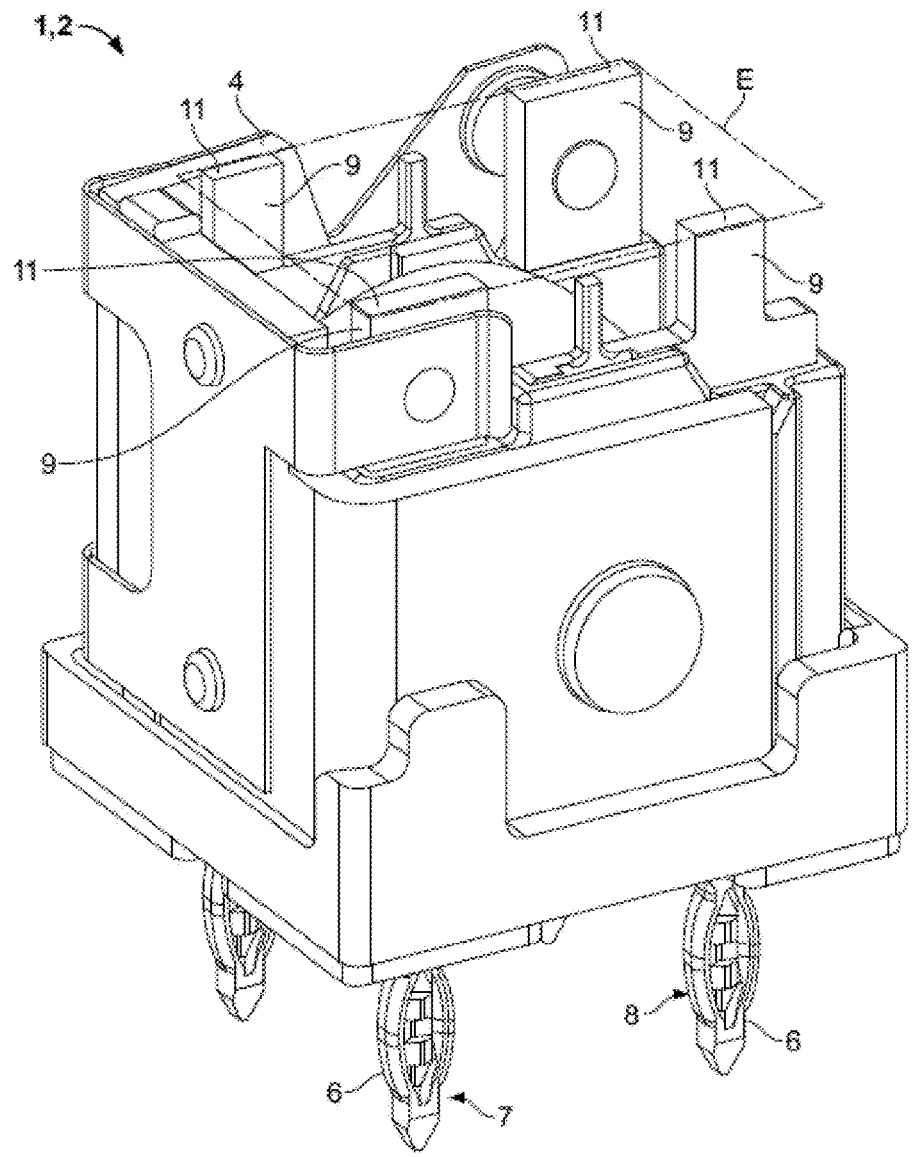
FIG. 2 is a perspective view of a second embodiment of an active electrical component according to the invention.

FIG. 2 illustrates a second embodiment of a component 1. It is constructed in a similar manner to the embodiment in FIG. 1, but has no housing 12. The pressing faces 11 are arranged at the sides of the force transmission structure 9 opposite the contacts 6. The force transmission structures 9 are in this instance, respectively, each formed by a single rigid member. The rigid members are each integral with the contacts 6.

The pressing faces 11 are located in a common plane E so that a planar pressing tool can be used. In an alternative embodiment, the pressing faces 11 could also be located in different planes and/or have different orientations. For example, the pressing faces 11 could provide an encoding possibility in order to prevent incorrect assembly of the component 1; a pressing face 11 could protrude from a plane formed by the other pressing faces 11. Together with a corresponding assembly tool, this would enable assembly only in a single orientation.

Figure 3:
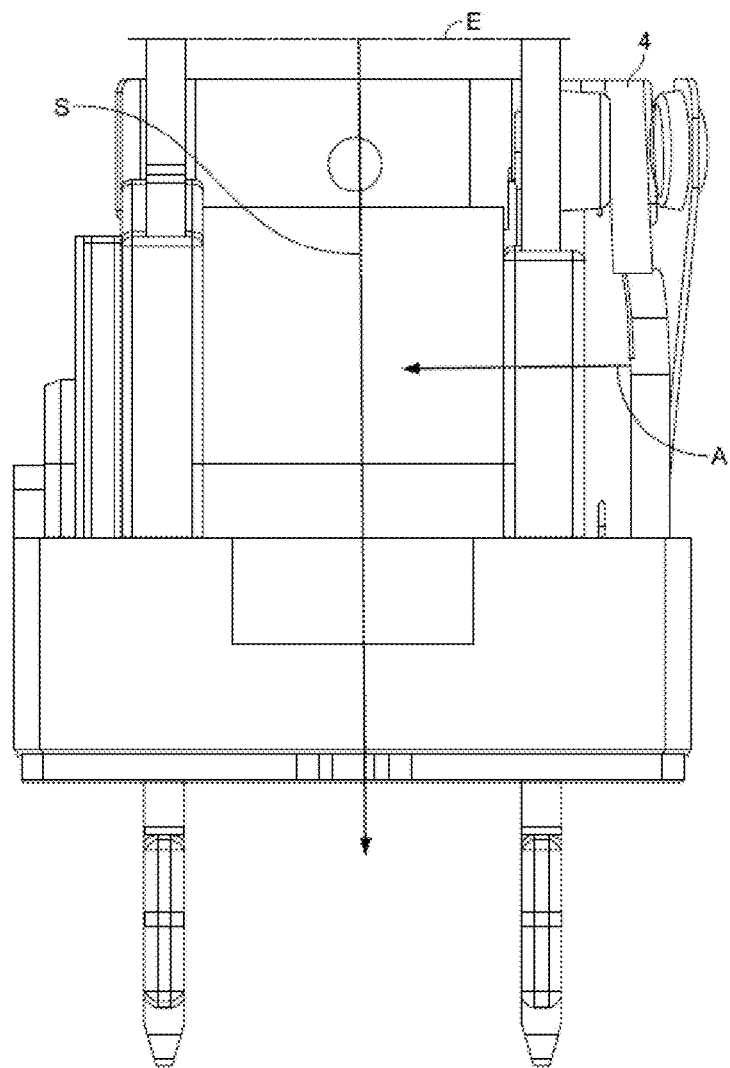
FIG. 3 is a side view of the active electrical component of FIG. 2.

FIG. 3 is a side view of the second embodiment of FIG. 2. It can be seen in particular that the insertion direction S extends perpendicularly relative to the movement direction A, in which the armature 4 is moved by the coil 3. A switching movement of the armature 4, which is subjected to small tolerances, is thereby not influenced by the high insertion forces in the insertion direction S since the insertion in the insertion direction S is decoupled from the movement of the armature 4 in the movement direction A.

Figure 4:
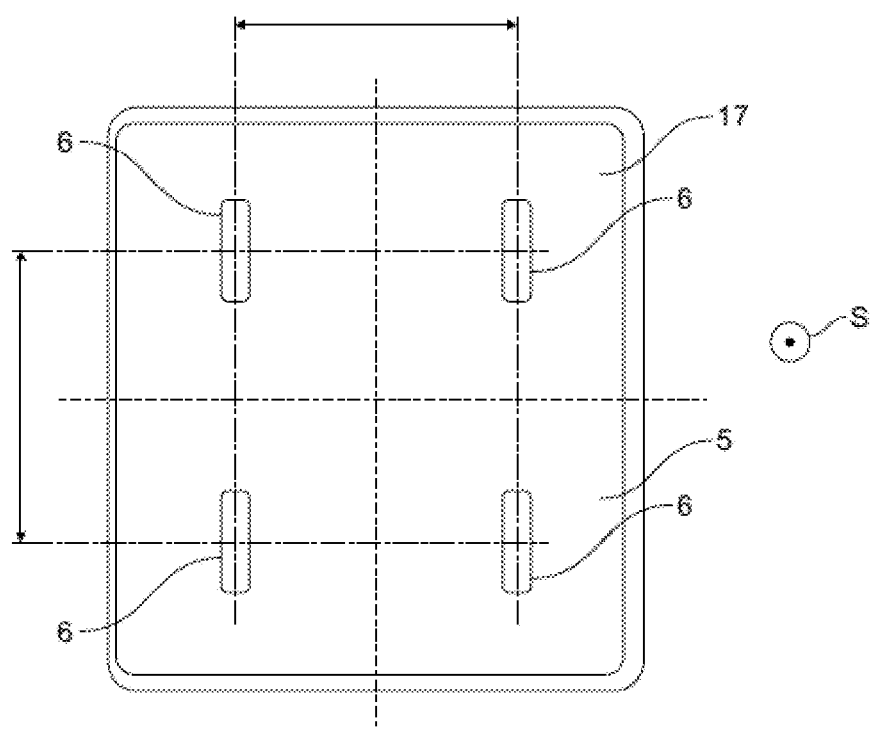
FIG. 4 is a bottom view of the active electrical component of FIG. 2.

FIG. 4 shows the second embodiment from below. It can be seen here in particular that the contacts 6 are located inside the base face 17 of the lower side 5. They therefore do not protrude laterally. All the force transmission structures 9 do not protrude laterally beyond this base face 17. The space required to fit the component 1 thereby substantially corresponds to the base face 17.

The force transmission structures 9 shown in FIGS. 2 to 4 are each integral with the contacts 6 and may be punched from a metal sheet. Of course, a force transmission structure 9 may also, for example, be produced in a different manner known to those with ordinary skill in the art such as by means of casting or forging. Furthermore, the force transmission structure 9 does not have to be integral with the contacts 6, but may also comprise a plurality of elements which are, for example, joined together in a flush manner in the insertion direction S.

Advantageously, the component 1 can be readily connected to a counter-element, and greater forces than normal can be used since the force transmission structure 9 transmits the forces to the contact 6 from the side of the component 1 opposite the contact 6 without damaging other elements at the inner side. The connection produced in this manner is more reliable as a result of the greater insertion forces since it cannot be so readily separated. Furthermore, high currents can be transmitted therewith.

What is claimed is:

1. An active electrical component, comprising:
   a housing;
   a contact positioned outside of the housing and extending away from an outer side of the housing in an insertion direction; and
   a force transmission structure extending to the contact in a continuous, linear manner through an interior of the housing from a side of the housing opposite the contact.

2. The active electrical component of claim 1, further comprising a coil and an armature which can be moved by the coil in a direction perpendicular to the insertion direction.

3. The active electrical component of claim 1, wherein the force transmission structure is constructed as a rigid member.

4. The active electrical component of claim 1, wherein the force transmission structure is constructed as a chain of a plurality of rigid members which are connected to and in abutment with each other at least when a force is applied to the chain in the insertion direction.

5. The active electrical component of claim 1, wherein the force transmission structure is constructed as a carrier frame.

6. The active electrical component of claim 1, wherein the contact is a pressing contact.

7. The active electrical component of claim 1, wherein the component is a switching element.

8. The active electrical component of claim 7, wherein the component is a relay.

9. The active electrical component of claim 7, wherein the component is a contactor.

10. The active electrical component of claim 1, wherein, at the side of the housing opposite the contact, the force transmission structure terminates in a pressing face.

11. The active electrical component of claim 10, wherein the pressing face is arranged in alignment with the contact with respect to the insertion direction.

12. The active electrical component of claim 11, wherein the pressing face is formed by the housing.

13. The active electrical component of claim 12, wherein the side of the housing opposite the contact is thicker in the region of the pressing face.

14. The active electrical component of claim 1, wherein a plurality of contacts are arranged at a lower side of the component.

15. The active electrical component of claim 14, wherein the plurality of contacts extends in an insertion direction perpendicular to the lower side.

16. The active electrical component of claim 15, wherein the plurality of contacts is positioned within a base face of the lower side.

17. The active electrical component of claim 16, wherein each of the plurality of contacts is integrally formed with a force transmission structure, and each of the force transmission structures terminates in a pressing face at the side of the housing opposite the plurality of contacts.

18. The active electrical component of claim 17, wherein the pressing faces of the plurality of contacts are located in a plane.

19. An active electrical component, comprising:
a housing;
a contact positioned outside of the housing and extending away from an outer side of the housing in an insertion direction; and
a force transmission structure extending to the contact in a continuous, linear manner through an interior of the housing from a side of the housing opposite the contact and the contact and force transmission structure are integrally formed.

20. An active electrical component, comprising:
a housing;
a contact is a pressing contact positioned outside of the housing and extending away from an outer side of the housing in an insertion direction and adapted to be inserted along the insertion direction into a socket of a printed circuit board; and
a force transmission structure extending to the contact in a continuous, linear manner through an interior of the housing from a side of the housing opposite the contact.

* * * * *